United States Patent
Nakata et al.

(10) Patent No.: US 10,115,890 B2
(45) Date of Patent: Oct. 30, 2018

(54) MAGNETIC THIN FILM AND APPLICATION DEVICE INCLUDING MAGNETIC THIN FILM

(71) Applicant: FUJI ELECTRIC CO., LTD., Kawasaki-shi (JP)

(72) Inventors: Hitoshi Nakata, Sendai (JP); Takehito Shimatsu, Sendai (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 15/251,056

(22) Filed: Aug. 30, 2016

(65) Prior Publication Data
US 2016/0372657 A1 Dec. 22, 2016

Related U.S. Application Data

(63) Continuation of application No. PCT/JP2015/002519, filed on May 19, 2015.

(30) Foreign Application Priority Data

Jun. 24, 2014 (JP) .................................. 2014-129203

(51) Int. Cl.
  *H01L 29/82* (2006.01)
  *H01L 43/10* (2006.01)
  (Continued)

(52) U.S. Cl.
  CPC ............ *H01L 43/10* (2013.01); *B81B 3/0091* (2013.01); *B81B 7/02* (2013.01); *G11B 5/3906* (2013.01);
  (Continued)

(58) Field of Classification Search
  CPC .... H01L 27/105; H01L 27/222; H01L 27/228
  See application file for complete search history.

(56) References Cited

U.S. PATENT DOCUMENTS

2003/0168673 A1   9/2003   Yuasa et al.
2003/0184921 A1   10/2003  Sugita et al.
(Continued)

FOREIGN PATENT DOCUMENTS

CN   1503912 A      6/2004
CN   101136213 A    3/2008
(Continued)

OTHER PUBLICATIONS

International Search Report in International Application No. PCT/JP2015/002519, dated Jul. 28, 2015.
(Continued)

*Primary Examiner* — Samuel Gebremariam
(74) *Attorney, Agent, or Firm* — Venable LLP; Michael A. Sartori; Kerri M. Patterson

(57) ABSTRACT

The problem of the invention is to provide a magnetic thin film having a high magnetic anisotropy constant Ku and a high coercive force Hc, and to provide an application device comprising the above magnetic thin film. The magnetic thin film of the present invention includes an ordered alloy including: at least one first element selected from the group consisting of Fe and Ni; at least one second element selected from the group consisting of Pt, Pd, Au and Ir; and Sc.

9 Claims, 6 Drawing Sheets

(51) Int. Cl.
- *B81B 7/02* (2006.01)
- *H01L 43/08* (2006.01)
- *B81B 3/00* (2006.01)
- *G11B 5/39* (2006.01)
- *H01L 27/22* (2006.01)
- *G11B 5/65* (2006.01)
- *H01F 10/12* (2006.01)
- *G11C 11/16* (2006.01)
- *H01F 10/32* (2006.01)

(52) U.S. Cl.
CPC ........... *G11B 5/653* (2013.01); *H01F 10/123* (2013.01); *H01L 27/222* (2013.01); *H01L 27/228* (2013.01); *H01L 43/08* (2013.01); *G11C 11/161* (2013.01); *H01F 10/3254* (2013.01)

(56) References Cited

U.S. PATENT DOCUMENTS

| | | |
|---|---|---|
| 2004/0246634 A1 | 12/2004 | Yuasa et al. |
| 2005/0135020 A1 | 6/2005 | Sugita et al. |
| 2006/0071287 A1 | 4/2006 | Yuasa et al. |
| 2007/0096229 A1 | 5/2007 | Yoshikawa et al. |
| 2008/0057350 A1 | 3/2008 | Das et al. |
| 2008/0088980 A1 | 4/2008 | Kitagawa et al. |
| 2009/0034134 A1 | 2/2009 | Yuasa et al. |
| 2010/0140727 A1* | 6/2010 | Shimatsu ............... G11B 5/656 257/421 |
| 2013/0028013 A1* | 1/2013 | Ikeda ..................... B82Y 25/00 365/158 |
| 2013/0034747 A1* | 2/2013 | Taniguchi .............. G11B 5/653 428/835.1 |
| 2014/0072829 A1 | 3/2014 | Inaba et al. |

FOREIGN PATENT DOCUMENTS

| | | |
|---|---|---|
| CN | 100580968 C | 1/2010 |
| JP | 2003-060263 A | 2/2003 |
| JP | 2005-333106 A | 12/2005 |
| JP | 2007-150265 A | 6/2007 |
| JP | 2008-059733 A | 3/2008 |
| JP | 2008-098523 A | 4/2008 |
| JP | 2010-135610 A | 6/2010 |
| JP | 2014-056624 A | 3/2014 |
| JP | 2014-056624 A | 3/2014 |

OTHER PUBLICATIONS

The First Office Action in counterpart Chinese Patent Application No. 201580011466.4, dated Mar. 27, 2017.

* cited by examiner (a)

(b)

MAGNETIC THIN FILM AND APPLICATION DEVICE INCLUDING MAGNETIC THIN FILM

CROSS-REFERENCES TO RELATED APPLICATIONS

This application is a continuation application of PCT Application No. PCT/JP2015/002519 under 37 Code of Federal Regulations § 1.53 (b) and the said PCT application claims the benefit of Japanese Patent Application No. 2014-129203, filed Jun. 24, 2014, which is hereby incorporated by reference wherein in its entirety.

BACKGROUND OF THE INVENTION

Field of the Invention

The invention, some embodiments of which are described in the present specification, relates to a magnetic thin film comprising an ordered alloy. More specifically, some constitutional examples of the embodiments relate to the magnetic thin film in which the ordered alloy comprises Fe and Pt as main ingredients and further comprises Sc. Further, the invention, some of embodiments of which is described in the present specification, relates to an application device comprising the above-described magnetic thin film.

Description of the Related Art

The application device comprising the magnetic thin film includes a magnetic recording medium, a tunnel magneto-resistive element (TMR), a magneto-resistive random access memory (MRAM), a micro electromechanical system (MEMS) device, and the like.

The magnetic recording medium will be explained, as the first example of the application devices comprising the magnetic thin film. The magnetic recording medium is used in a hard disc drive, a magneto-optical (MO) disc, a magnetic tape, and the like. Magnetic recording systems used therein include an in-plane magnetic recording system and a perpendicular magnetic recording system.

The in-plane magnetic recording system is a conventionally used system wherein magnetic recording is conducted horizontally with respect to the surface of the hard disc, for example. However, the perpendicular magnetic recording system have been mainly used in recent years, in which magnetic recording is conducted perpendicularly to the surface of the disc, and higher recording density can be achieved.

A magnetic recording medium using in the perpendicular magnetic recording system (hereinafter, also referred to as "perpendicular magnetic recording medium") at least comprises a non-magnetic substrate, and a magnetic recording layer formed of a hard-magnetic material. Optionally, the perpendicular magnetic recording medium may further comprise: a soft-magnetic under layer playing a role in concentrating the magnetic flux generated by a magnetic head onto the magnetic recording layer; a seed layer for orienting the hard-magnetic material in the magnetic recording layer in an intended direction; a protective film for protecting the surface of the magnetic recording layer; and the like.

An urgent need for reduction in the grain diameter of the magnetic crystal grains in the magnetic layer arises in recent years, in order to further increase the recording density of the perpendicular magnetic recording medium. On the other hand, the reduction in the grain diameter of the magnetic crystal grains leads to a decrease in thermal stability of the recorded magnetization. Thus, the magnetic crystal grains in the magnetic layer need to be formed of materials with higher magnetocrystalline anisotropies, in order to compensate the decrease in thermal stability due to the reduction in the grain diameter of the magnetic crystal grains.

However, the magnetic recording medium having the magnetic recording layer formed of the material with higher magnetocrystalline anisotropies possesses a high coercive force which makes it difficult to record magnetization thereon. In order to overcome this recording difficulty, energy-assisted magnetic recording systems such as a heat-assisted magnetic recording system and a microwave-assisted magnetic recording systems have been proposed. The heat-assisted magnetic recording system utilizes temperature dependence of a magnetic anisotropy constant (Ku) of the magnetic material, that is, a property that the Ku decreases as the temperature rises. A head having a function to heat the magnetic recording layer is used in this system. That is, writing is conducted during a magnetic switching field is reduced by raising the temperature of the magnetic recording layer to temporarily decrease the Ku. Once the temperature drops, recorded magnetization can be held stably, since the Ku returns to the original high value.

The tunnel magneto-resistive element (TMR) and the magneto-resistive random access memory (MRAM) involving the TMR will be explained, as the second example of the application devices comprising the magnetic thin film. Conventional memories such as a flash memory, a static random access memory (SRAM), and a dynamic random access memory (DRAM) record information with electrons in a memory cell. On the other hand, the MRAM is a memory using a magnetic body, which is the same as the hard disc and the like, as a recording medium.

The MRAM has an address access time of approximately 10 ns and a cycle time of approximately 20 ns. Therefore, the reading/writing rate of the MRAM is approximately five times faster than that of the DRAM, and comparable with that of the SRAM. Further, the MRAM has advantages of low power consumption that is approximately tenth of that of the flash memory, and capability of higher density integration.

The TMR used in the MRAM can be produced by various techniques. For example, a stacked body comprising the TMR can be obtained by forming a ferromagnetic thin film onto an anti-ferromagnetic thin film. Japanese Patent Laid-Open No. 2005-333106 discloses an exchange-coupled device in which an anti-ferromagnetic layer and a ferromagnetic layer which is exchange-coupled with the anti-ferromagnetic layer are sequentially stacked onto a substrate, and the anti-ferromagnetic layer comprises an ordered phase of an Mn—Ir alloy ($Mn_3Ir$). A schematic cross-sectional view of the TMR including the above-describe exchange-coupled device is shown in FIG. 5 of the above document. Further, a spin-valve magneto-resistive element comprising the exchange-coupled device is shown in FIG. 4 of the above document.

The micro electro mechanical system (MEMS) device will be explained, as the third example of the application devices comprising the magnetic thin film. The MEMS device is a general term for devices in which mechanical component parts, sensors, actuators and/or electronic circuits are integrated onto a single substrate. The useful substrate includes a silicon substrate, a glass substrate, and a substrate of organic material. Exemplary application of the MEMS devices includes a digital micro mirror device (DMD) which is one of optical elements in a projector; a micro nozzle used in a head of an inkjet printer; and various sensors such as pressure sensors, accelerometers, and flow sensors. In recent years, it is expected that application of the MEMS device will be developed in a field of medical care, in addition to manufacturing industry.

There is a need of improvement in magnetic properties of the magnetic thin film, particularly increase in a uniaxial magnetic anisotropy constant (Ku), in all of the above-described application devices (the magnetic recording medium, TMR, MRAM, and MEMS device). In this context, it is considered that development of the magnetic thin film exhibiting such excellent Ku will greatly contribute to increase in capacity and/or density of the recording medium and memory.

Ordered alloys have been received attention and investigated actively, as a candidate for a material exhibiting the excellent Ku. Interested ordered alloys include various materials such as FePt and CoPt. Search of additive material which is added to these material to improve properties have been continued. In this context, Japanese Patent Laid-Open No. 2010-135610 proposes a magnetic thin film containing an $L1_1$ type Co—Pt—C ordered alloy. This ordered alloy optionally comprises at least one additional element selected from the group consisting of Ni, Fe, Mn, Cr, V, Ti, Sc, Cu, Zn, Pd, Rh, Ru, Mo, Nb, Zr, Ag, Ir, Au, Re, W, Ta, Hf, Al, Si, Ge, and B. However, influence of these additional elements on the magnetic thin film has not been investigated concretely.

Japanese Patent Laid-Open No. 2008-059733 proposes a magnetic recording medium having a magnetic recording layer with a granular structure, wherein the magnetic recording layer consists of magnetic crystal grains consisting of an $L1_0$ type ordered alloy such as FePd, FePt, CoPt and MnAl, and a non-magnetic crystal grain boundary consisting of an oxide. Here, the oxide consists of oxygen and one or more element in which at least one of the elements has a negative reduction potential. Scandium (Sc) is described as an exemplary element which constitutes the oxide. However, the above described magnetic recording layer with the granular structure is not evaluated in the above document. In addition, the above document does not teach or suggest introduction of an additional element to the $L1_0$ type ordered alloy.

As described above, it is the current state that Sc as the material to be added to the ordered alloy is little investigated. There is almost no advance in the investigation of magnetic properties of the ordered alloys to which Sc is added, especially the magnetic anisotropy constant Ku of such ordered alloys.

SUMMARY OF THE INVENTION

The purpose of the invention, some embodiments of which are described in the present specification, is to provide a magnetic thin film with a high magnetic anisotropy constant Ku and a high coercive force Hc, and to provide an application device comprising the magnetic thin film.

A magnetic thin film which is one of exemplary embodiments of the present invention comprises an ordered alloy, wherein the ordered alloy comprises: at least one first element selected from the group consisting of Fe and Ni; at least one second element selected from the group consisting of Pt, Pd, Au and Ir; and Sc. Preferably, the first element is Fe and the second element is Pt. Further, the ordered alloy preferably has an $L1_0$ type ordered structure. Besides, the magnetic thin film of this embodiment may have a granular structure consisting of magnetic crystal grains comprising the above-described ordered alloy and a non-magnetic crystal grain boundary. The non-magnetic crystal grain boundary may comprise at least one material selected from the group consisting of carbon, boron, an oxide and a nitride. Further, a micro electro mechanical system can be produced with the magnetic thin film of this embodiment.

A magnetic recording medium which is one of exemplary embodiments of the present invention comprises a non-magnetic substrate and a magnetic recording layer, wherein the magnetic recording layer comprises the above-described magnetic thin film.

A tunnel magneto-resistive element which is one of exemplary embodiments of the present invention comprises a fixed magnetic layer, a free magnetic layer, and a barrier layer, wherein the barrier layer is disposed between the fixed magnetic layer and the free magnetic layer, and at least one of the fixed magnetic layer and the free magnetic layer comprises the above-described magnetic thin film. A magneto-resistive random access memory can be produced with this tunnel magneto-resistive element.

By adopting the above-described constitution, the magnetic thin film which is one of exemplary embodiments of the present invention can exhibit both of a high magnetic anisotropy constant Ku and a high coercive force Hc. Further, the magnetic thin film having the above-described properties is useful as the magnetic recording layer in the magnetic recording medium having a high recording density. Further, it is considered that the above-described magnetic thin film is effective to miniaturization of the magneto-resistive element, and increase in integration degree of the magneto-resistive random access memory and micro electro mechanical system.

Further features of the present invention will become apparent from the following description of exemplary embodiments (with reference to the attached drawings).

BRIEF DESCRIPTION OF THE DRAWINGS

FIG. 2 is a schematic cross-sectional diagram showing a configuration example of the tunnel magneto-resistive element, wherein FIG. 2(a) shows a state where the signal of "0" is recorded, and FIG. 2(b) shows a state where the signal of "1" is recorded;

DESCRIPTION OF THE EMBODIMENTS

Figure 1:
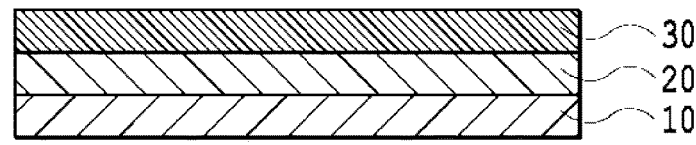
FIG. 1 is a schematic cross-sectional diagram showing a configuration example of the magnetic recording medium of the second embodiment.

A magnetic thin film of the first embodiment comprises an ordered alloy, wherein the ordered alloy comprises: at least one first element selected from the group consisting of Fe and Ni; at least one second element selected from the group consisting of Pt, Pd, Au and Ir; and Sc. Preferably, the ordered alloy has an $L1_0$ type ordered structure. The preferable $L1_0$ type ordered alloy includes FePtSc and FePdSc.

Further, the especially preferable $L1_0$ type ordered alloy includes Fe as the first element, Pt as the second element, and Sc.

In the ordered alloy used in this embodiment, the ratio of the first element to the second element is in a range from 0.7 to 1.3, preferably in a range from 0.8 to 1.1, based on the number of atoms. By adopting the compositional ratio within these ranges, it becomes possible to obtain a $L1_0$ type ordered alloy having a high magnetic anisotropy constant Ku.

Preferably, Sc in the ordered alloy used in this embodiment is Sc at a zerovalent oxidation state, that is, Sc in a metallic state. Without intending to be limited by any theory, it can be considered that addition of Sc results in deformation in which the length of the c axis of the crystal lattice of the $L1_0$ type ordered structure, and the high magnetic anisotropy constant Ku and a high coercive force Hc are obtained by this deformation of the crystal lattice. The ordered alloy does not contain Sc in a higher oxidation state such as oxides of Sc, since it is difficult to be considered that the wording effect of this embodiment can be achieved by compounds of Sc in the higher oxidation state. This is because substitution of other atoms with the compounds of Sc in the higher oxidation state, or a process to deform the crystal lattice such as intrusion of the compounds of Sc in the higher oxidation state into the lattice hardly occurs in principle.

In this embodiment, all of the atoms in the ordered alloy do not necessarily possess the ordered structure. Instead, it is necessary that the degree of order S, which represents a level of the ordered structure, is not less than a predetermined value. The degree of order S is determined by measuring the magnetic thin film by an X-ray diffraction method (XRD), and calculating a ratio of the measured value to a theoretical value in a completely ordered state. For the $L1_0$ type ordered alloy, the degree of order S is calculated with integrated intensities of (001) and (002) peaks due to the ordered alloy. The degree of order S is determined as a square root of a quotient of a ratio of the measured integrated intensity of the (001) peak to that of the (002) peak, by a theoretically calculated ratio of the integrated intensity of the (001) peak to that of the (002) peak in the case where the ordered alloy is completely ordered. If such obtained degree of order S is not less than 0.5, the ordered alloy will have a magnetic anisotropy constant Ku practical for the magnetic thin film.

The magnetic thin film of this embodiment may have a granular structure which consists of magnetic crystal grains consisting of the above-described ordered alloy and a non-magnetic crystal grain boundary. Here, the non-magnetic crystal grain boundary may comprise carbon (C), boron (B), an oxide and a nitride. The oxide useful in the non-magnetic crystal grain boundary includes $SiO_2$, $TiO_2$, and ZnO. The nitride useful in the non-magnetic crystal grain boundary includes $Si_3N_4$ and TiN. In the granular structure, the magnetic crystal grains are magnetically separated from each other by the non-magnetic crystal grain boundary. When the magnetic thin film is used as the magnetic recording layer of a magnetic recording medium, this magnetic separation contributes improvement in SNR of the magnetic recording medium.

The magnetic thin film of this embodiment is preferably formed by a sputtering method involving heating of a substrate. Any method well known in the art, such as a DC magnetron sputtering method and an RF sputtering method can be used as the sputtering method. This is also the case for the description of "sputtering method" in the following explanation, unless otherwise described. The substrate temperature when forming the magnetic thin film is preferably within a range from 400° C. to 500° C. By adopting the substrate temperature within this range, it becomes possible to improve the degree of order S of the $L1_0$ type ordered alloy material in the magnetic thin film. The sputtering method may use two targets, one of which is a target consisting of the first and second elements and the other is a target consisting of Sc. Alternatively, the sputtering method may use three targets, that is, a target consisting of the first element, a target consisting of the second element, and a target consisting of Sc. In these cases, the ratio of the first element, the second element, and Sc in the ordered alloy of the magnetic thin film can be controlled by separately supplying electric power to respective targets.

The substrate to be used for forming the magnetic thin film of this embodiment may be various substrates having a flat surface. For example, NiP-plated Al alloy, tempered glass, crystallized glass, silicon, or MgO can be used as the substrate.

A target in which material for forming the magnetic crystal grains and material for forming the non-magnetic crystal grain boundary are mixed in a predetermined ratio may be used, when forming the magnetic thin film having the granular structure. Alternatively, a target consisting of material for forming the magnetic crystal grains and a target consisting of material for forming the non-magnetic crystal grain boundary may be used. As described above, a plurality of targets may be used as the target for forming the magnetic crystal grains. In this case, the ratio of the magnetic crystal grains and the non-magnetic crystal grain boundary in the magnetic thin film can be controlled by separately supplying electric power to respective targets.

The magnetic recording medium of the second embodiment comprises a non-magnetic substrate and a magnetic recording layer, wherein the magnetic recording layer comprises at least one magnetic thin film of the first embodiment. For example, in the constitutional example shown in FIG. 1, the magnetic recording medium comprises non-magnetic substrate 10, magnetic recording layer 30, and seed layer 20 which may be optionally disposed.

The non-magnetic substrate 10 may be various substrates having a flat surface. The non-magnetic substrate 10 may be formed of material commonly used in magnetic recording media. For example, the non-magnetic substrate 10 may be formed of NiP-plated Al alloy, tempered glass, crystallized glass, MgO, or the like.

The magnetic recording layer 30 may be a single layer or a stacked body of a plurality of layers. If the magnetic recording layer 30 consists of a single layer, the magnetic recording layer 30 is the magnetic thin film of the first embodiment.

If the magnetic recording layer 30 consists of a plurality of layers, at least one of the plurality of layers is the magnetic thin film of the first embodiment. The other layers of the plurality of layers may be: a layer for the purpose of controlling a Curie temperature (Tc); a cap layer for adjustment of switching of magnetization; an exchange coupling controlling layer for controlling exchange coupling between two magnetic layers; a magnetic layer for adjustment of magnetic properties; a layer for controlling ferromagnetic resonance frequency for a microwave-assisted magnetic recording method; or the like. These layers can be formed by any method known in the art, including the sputtering method.

The magnetic recording medium of this embodiment may further comprise one or more layers selected from the group consisting of an adhesive layer, a heat sink layer, a soft-magnetic under layer, an interlayer, and seed layer 20, between the non-magnetic substrate 10 and the magnetic recording layer 30. Further, the magnetic recording medium of this embodiment may further comprise a protective layer on the magnetic recording layer 30. Further, the magnetic recording medium of this embodiment may further comprise a liquid lubricant layer on the magnetic recording layer 30 or the protective layer.

The adhesive layer, which may be formed optionally, is used for enhancing the adhesion between the layer formed on it and the layer formed under it (including the non-magnetic substrate 10). If the adhesive layer is disposed on the upper surface of the non-magnetic substrate 10, the adhesive layer can be formed of a material having good adhesion to the material of the non-magnetic substrate 10. Such material includes a metal such as Ni, W, Ta, Cr or Ru, or an alloy containing these metals. Alternatively, the adhesive layer may be formed between two constituent layers other than the non-magnetic substrate 10. The adhesive layer may be a single layer or have a stacked structure with plural layers.

The soft-magnetic under layer, which may be formed optionally, controls the magnetic flux emitted from a magnetic head to improve the read-write characteristics of the magnetic recording medium. The material for forming the soft-magnetic under layer includes: a crystalline material such as a NiFe alloy, a sendust (FeSiAl) alloy, or a CoFe alloy; a microcrystalline material such as FeTaC, CoFeNi or CoNiP; and an amorphous material including a Co alloy such as CoZrNb or CoTaZr. The optimum thickness of the soft-magnetic under layer depends on the structure and characteristics of the magnetic head used in magnetic recording. When forming the soft-magnetic under layer continuously with other layers, the soft-magnetic under layer preferably has a thickness in a range from 10 nm to 500 nm (both inclusive), in view of productivity.

When using the magnetic recording medium in a heat-assisted magnetic recording system, a heat sink layer may be provided. The heat sink layer is a layer for effectively absorbing excess heat of the magnetic recording layer 30 that is generated during heat-assisted magnetic recording. The heat sink layer can be formed of a material having a high thermal conductivity and a high specific heat capacity. Such material includes a Cu simple substance, an Ag simple substance, an Au simple substance, or an alloy material composed mainly of these substances. As used herein, the expression "composed mainly of" means that the content of the concerned material is 50 wt % or more. In consideration of its strength or the like, the heat sink layer can be formed of an Al—Si alloy, a Cu—B alloy or the like. Further, the heat sink layer can be formed of a sendust (FeSiAl) alloy, a soft-magnetic CoFe alloy, or the like. By using soft-magnetic material, the function of concentrating a perpendicular magnetic field generated by the head can be imparted to the heat sink layer, and thereby complementing the function of the soft-magnetic under layer. The optimum thickness of the heat sink layer depends on the amount and distribution of heat generated during heat-assisted magnetic recording, as well as the layer configuration of the magnetic recording medium and the thickness of each constituent layer. When forming the heat sink layer continuously with other constituent layers, the heat sink layer preferably has a thickness of 10 nm or more and 100 nm or less, in view of the productivity. The heat sink layer can be formed by any process known in the art, such as a sputtering method or a vacuum deposition method. Normally, the heat sink layer is formed by the sputtering method. The heat sink layer can be formed between the substrate 10 and the adhesive layer, between the adhesive layer and the interlayer, or the like, in consideration of properties required for the magnetic recording medium.

The interlayer is a layer for controlling crystallinity and/or crystal axis orientation of the seed layer 20 which is formed on the interlayer. The interlayer may be a single layer or may be formed with a plurality of layers. Preferably, the interlayer is a non-magnetic film which is formed of Cr metal or alloys in which at least one metal selected from the group consisting of Mo, W, Ti, V, Mn, Ta, and Zr is added to Cr that is a main component. The interlayer can be formed by any process known in the art, such as a sputtering method.

The seed layer 20 has a function to ensure the adhesion between the underlying layer such as the interlayer and the magnetic recording layer 30 and a function to control the grain diameter and the crystalline orientation of the magnetic crystal grains in the magnetic recording layer 30 which is an upper layer of the seed layer 20. The seed layer 20 is preferably non-magnetic. In addition, the seed layer preferably plays a role of a thermal barrier to control temperature rise and temperature distribution of the magnetic recording layer 30, when the magnetic recording medium of this embodiment is utilized in the heat-assisted magnetic recording system. In order to control temperature rise and temperature distribution of the magnetic recording layer 30, the seed layer 20 preferably has both of a function to rapidly raise the temperature of the magnetic recording layer 30 when the magnetic recording layer is heated, and a function to transfer the heat in the magnetic recording layer 30 to the underlying layer such as the interlayer via heat transfer in the depth direction, before heat transfer in the in-plane direction of the magnetic recording layer 30 occurs.

In order to achieve the above functions, the material of the seed layer 20 is appropriately selected in accordance with the material of the magnetic recording layer 30. More particularly, the material of the seed layer 20 is selected in accordance with the material of the magnetic crystal grains in the magnetic recording layer 30. For example, the seed layer is preferably formed of Pt metal or an NaCl type compound, when the magnetic crystal grains in the magnetic recording layer 30 is formed of an $L1_0$ type ordered alloy. Especially preferably, the seed layer 20 is formed of an oxide such as MgO and $SrTiO_3$, or a nitride such as TiN. The seed layer 20 may be formed by stacking a plurality of layers consisting of the above-described material. The seed layer 20 may have a thickness from 1 nm to 60 nm, preferably from 1 nm to 20 nm, in view of improvement in crystallinity of the magnetic crystal grains in the magnetic recording layer 30 and improvement in productivity. The seed layer 20 can be formed by any method known in the art, such as a sputtering method and a vacuum deposition method.

The protective layer can be formed of a material that is conventionally used in the field of magnetic recording media. Specifically, the protective layer can be formed of non-magnetic metal such as Pt, a carbon-based material such as diamond-like carbon, or a silicon-based material such as silicon nitride. The protective layer may be a single layer or have a stacked structure. The protective layer with the stacked structure may have a stacked structure of two types of carbon-based material having different characteristics from each other, a stacked structure of metal and a carbon-based material, or a stacked structure of metallic oxide film and a carbon-based material, for example. The protective layer can be formed by any process known in the art such as a sputtering method, a CVD method, or a vacuum deposition method.

The liquid lubricant layer can be formed of a material conventionally used in the field of magnetic recording media. For example, perfluoropolyether-based lubricants or the like can be used. The liquid lubricant layer can be formed by a coating method such as a dip-coating method or a spin-coating method, for example.

Figure 2:
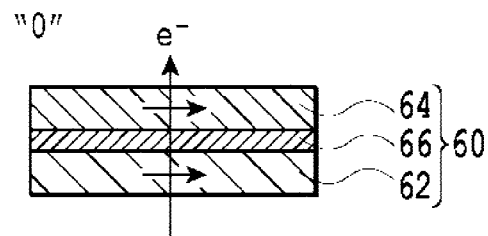
Figure 2:
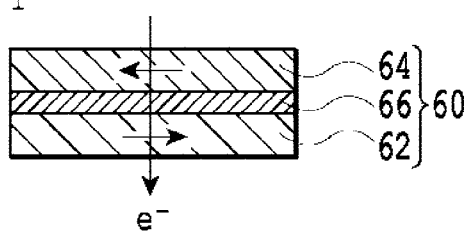

A magneto-resistive element of the third embodiment will be explained. A tunnel magneto-resistive element (TMR) will be explained below by way of example, for conciseness. As shown in FIG. 2, the TMR comprises fixed magnetic layer 62, free magnetic layer 64, and barrier layer 66 between the fixed magnetic layer 62 and the free magnetic layer 64, wherein at least one of the fixed magnetic layer 62 and the free magnetic layer 64 is the magnetic thin film of the first embodiment.

The free magnetic layer 64 is a layer in which the direction of magnetization can be changed. The magnetization can be changed by spin injection with an electric current through the tunnel magneto-resistive element 60. Alternatively, the magnetization may be changed with an externally applied magnetic field.

The barrier layer 66 is a component for providing a barrier for flowing a tunnel current between the fixed magnetic layer 62 and the free magnetic layer 64. The barrier layer 66 can be formed as a thin film of an oxide such as magnesium oxide (MgO) and aluminum oxide ($Al_2O_3$). The barrier layer 66 can be formed by any method and conditions known in the art such as a sputtering method and a vacuum deposition method, for example.

The fixed magnetic layer 62 is a component disposed as a magnetic layer in which the direction of magnetization remains intact even when the electric current flows through, or the external magnetic field is applied to the tunnel magneto-resistive element 60. The magnitude of the tunnel current flowing through the barrier layer 66 can be changed with the difference in the directions of magnetization in the fixed magnetic layer 62 and the free magnetic layer 64.

The tunnel magneto-resistive element 60 having such constitution operates with changing the direction of magnetization in the free magnetic layer 64 with the electric current or external field supplied to the element. For example, the tunnel magneto-resistive element in which the magnetization is changed by spin injection generated by flowing of an electric current operates as follow. As shown in FIG. 2(a), it is possible to make the directions of magnetization in the fixed magnetic layer 62 and the free magnetic layer 64 parallel, by flowing an electric current from the fixed magnetic layer 62 to the free magnetic layer 64. Besides, as shown in FIG. 2(b), it is possible to make the directions of magnetization in the fixed magnetic layer 62 and the free magnetic layer 64 anti-parallel, by flowing an electric current from the free magnetic layer 64 to the fixed magnetic layer 62. The two states shown in FIGS. 2(a) and 2(b) can be reversibly changed each other. The tunnel magneto-resistive element 60 can store information of "0" and "1", based on whether the directions of magnetization in the fixed magnetic layer 62 and the free magnetic layer 64 are parallel or anti-parallel. In FIGS. 2(a) and 2(b), "0" is assigned to the case where the directions of magnetization in the fixed magnetic layer 62 and the free magnetic layer 64 are parallel, and "1" is assigned to the case where the directions of magnetization in the fixed magnetic layer 62 and the free magnetic layer 64 are anti-parallel. However, this correlation can be reversed. Further, FIGS. 2(a) and 2(b) exemplarily show the case where the directions of magnetization in the fixed magnetic layer 62 and the free magnetic layer 64 are horizontal with respect to the layers. However, the directions of magnetization in the fixed magnetic layer 62 and the free magnetic layer 64 can be perpendicular to the layers. Also in this case, information of "0" and "1" can be stored as a change in magnitude of the tunnel current flowing through the barrier layer 66, based on whether the directions of magnetization of the two layers are parallel or anti-parallel. In addition to the TMR explained above, a magneto-resistive element may have a structure in which the fixed magnetic layer 62 and the free magnetic layer 64 are in direct contact with each other.

Figure 3:
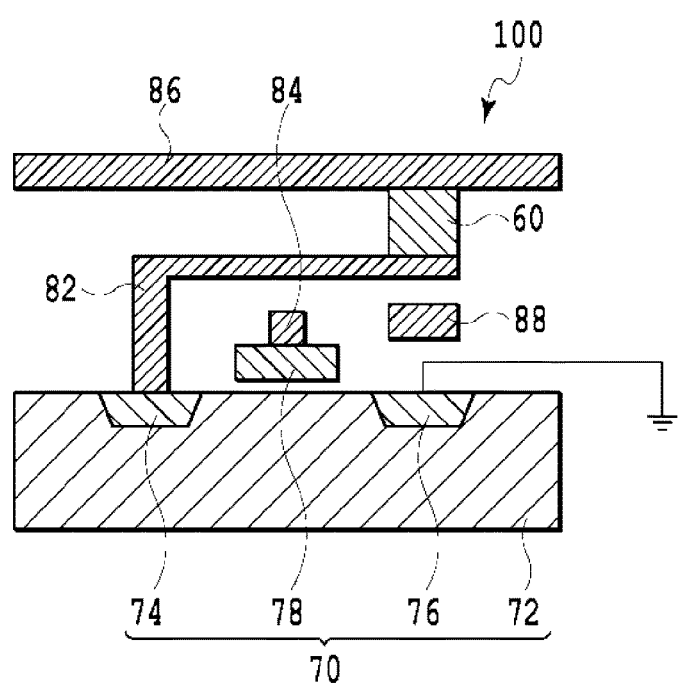
FIG. 3 is a schematic cross-sectional diagram showing a configuration example of the magneto-resistive random access memory.

One constitutional example of a magneto-resistive random access memory (MRAM) of the fourth embodiment is shown in FIG. 3. FIG. 3 relates to the constitutional example in which the signal stored in the TMR is changed by an externally applied magnetic field. The MRAM shown in FIG. 3 comprises: a MOS-FET 70 comprising substrate 72, source 74, drain 76, and gate 78; tunnel magneto-resistive element 60 that is in communication with the source 74 via contact 82; word line 84 in communication with the gate 78; bit line 86 in communication with the tunnel magneto-resistive element 60; and digit line for applying a writing magnetic field to the tunnel magneto-resistive element 60.

In the MRAM of this embodiment, a signal of "0" or "1" is written into the tunnel magneto-resistive element 60, with a composite magnetic field obtained by flowing an electric current through the bit line 86 and the digit line 88. The bit line 86 and the digit line 88 run in directions which intersect with each other, and therefore it is possible to store the signal into the tunnel magneto-resistive element 60 which is positioned at the intersection of the bit line 86 and the digit line 88 through which the electric current flows.

On the other hand, the signal of the MRAM 100 can be read out by detecting an electric current flowing from the bit line 86 to the MOS-FET 70 via the tunnel magneto-resistive element 60 and the contact 82 when a voltage is applied to the bit line 86 in the state where the MOS-FET 70 is on by flowing an electric current through the word line 84. The electric current to be detected in this situation corresponds to the tunnel current of the tunnel magneto-resistive element 60, and is correspondent with the signal of "0" or "1". Methods other than the constitutional example shown in FIG. 3 may be adopted. For example, a spin injection type magneto-resistive element may be adopted so that the signal to be stored is changed by an electric current flowing through the magneto-resistive element.

In addition to the above-described second to fourth embodiments, the magnetic thin film of the first embodiment can be used in a MEMS device. The MEMS device can be formed by any publicly known technique in which the magnetic thin film of the first embodiment is incorporated into a predetermined member.

EXAMPLES

Example 1

Non-magnetic substrate 10 was prepared by washing a monocrystalline (001) MgO substrate having a flat surface (manufactured by Tateho Chemical Industries Co., Ltd.). The washed non-magnetic substrate 10 was brought into a sputtering device. Then, Pt seed layer 20 having a thickness of 20 nm was formed by an RF magnetron sputtering method using a Pt target in Ar gas at a pressure of 0.4 Pa, after the non-magnetic substrate 10 was heated to a temperature of 350° C.

Next, the non-magnetic substrate 10 onto which the seed layer 20 had been formed was heated to a temperature of 350° C., then FePtSc magnetic recording layer 30 having a thickness of 10 nm was formed by an RF magnetron sputtering method using an FePt target and an Sc target in Ar gas at a pressure of 0.6 Pa, to obtain a magnetic recording medium having the structure shown in FIG. 1. Here, a target having a Fe/Pt ratio of 45/55 was used as the FePt target. Further, the electric power applied to the FePt target was fixed to 300 W, and the electric power applied to the Sc target was changed in a range from 40 W to 450 W, and thereby the content of Sc in the magnetic recording layer 30 was adjusted.

It was confirmed by XRD that the magnetic recording layer 30 of the resultant magnetic recording medium had a $L1_0$ type ordered structure. Further, the lengths of the a and c axes of the crystal lattice of the $L1_0$ type ordered structure were measured by XRD. Furthermore, a hysteresis curve of the resultant magnetic recording medium was measured by a vibrating sample magnetometer (VSM) to determine a coercive force Hc. Moreover, the composition of the magnetic recording layer 30 of the resultant magnetic recording medium was analyzed by Rutherford backscattering spectrometry (RBS). The above measurement results are shown in Table 1.

[Table 1]

TABLE 1

Composition of the magnetic recording layer, and Evaluation of crystalline structure and magnetic properties

| | | | | crystalline structure | | magnetic properties | |
|---|---|---|---|---|---|---|---|
| | composition (at %) | | | length of c axis | length of a axis | coercive force | magnetic anisotropy constant |
| sample | Fe | Pt | Sc | (Å) | (Å) | Hc*1 | Ku*2 |
| 1 | 44.8 | 55.2 | 0.0 | 3.703 | 3.907 | 3.6(290) | 21.2(2.12) |
| 2 | 44.9 | 53.9 | 1.2 | 3.703 | 3.909 | 4.1(330) | 25.0(2.50) |
| 3 | 45.1 | 53.3 | 1.7 | 3.708 | 3.910 | 7.4(590) | 25.2(2.52) |
| 4 | 44.6 | 53.0 | 2.4 | 3.711 | 3.911 | 8.5(680) | 26.7(2.67) |
| 5 | 44.7 | 52.1 | 3.2 | 3.717 | 3.912 | 6.1(490) | 25.3(2.53) |
| 6 | 45.1 | 51.1 | 3.8 | 3.721 | 3.912 | 4.1(330) | 22.6(2.26) |
| 7 | 43.5 | 50.8 | 5.7 | 3.740 | 3.912 | 2.3(180) | 15.6(1.56) |
| 8 | 41.7 | 50.5 | 7.8 | 3.764 | 3.914 | 1.8(140) | 11.1(1.11) |
| 9 | 41.1 | 48.7 | 10.2 | 3.799 | 3.917 | 0.5(40) | 5.7(0.57) |
| 10 | 40.4 | 46.9 | 12.7 | 3.839 | 3.919 | 0.1(8) | 2.8(0.28) |
| 11 | 39.4 | 45.6 | 15.0 | — | — | 0.1(8) | 2.4(0.24) |
| 12 | 39.2 | 43.5 | 17.3 | — | — | 0.1(8) | 2.3(0.23) |

Figure 4:
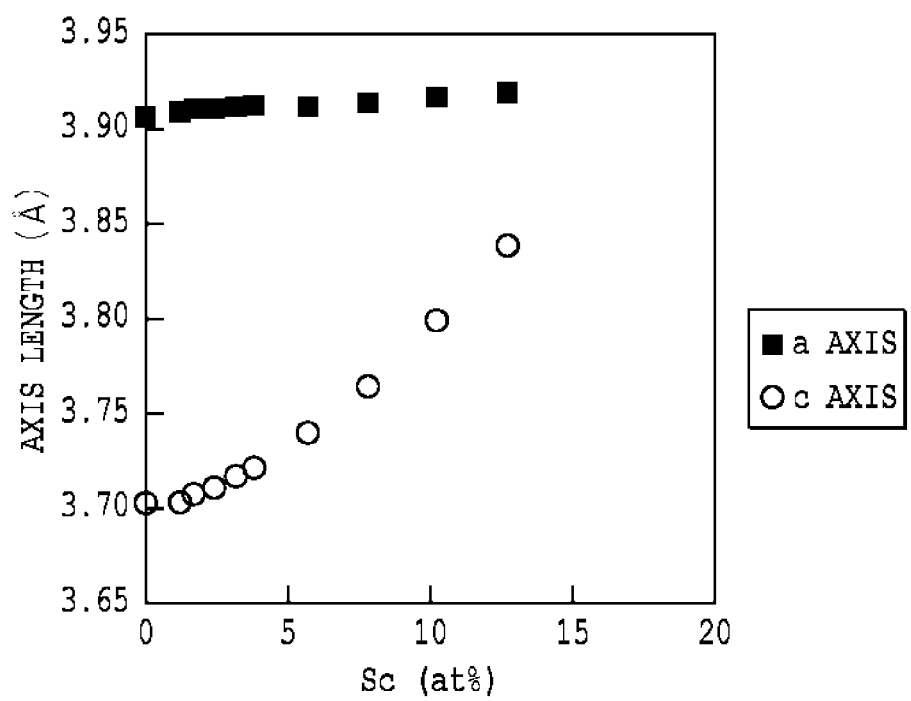
FIG. 4 is a graphical representation showing the relationship of the content of Sc and the lengths of the a and c axes of the crystal lattice in the magnetic recording medium of Example 1.

*1: The value is represented in kOe, and the converted value in parentheses is represented in A/mm.
*2 The value is represented in $10^6$ erg/cm$^3$, and the converted value in parentheses is represented in $10^6$ J/m$^3$ The relationship between the content of Sc in the magnetic recording layer 30 and the lengths of the a and c axes of the crystal lattice is shown in FIG. 4. As understood from FIG. 4, the length of the a axis of the crystal lattice was little changed, even though the content of Sc increases. On the other hand, the length of the c axis of the crystal lattice increases, as the content of Sc increases. From these results, it is considered that Sc is present in the FePt crystal grains.

Figure 5:
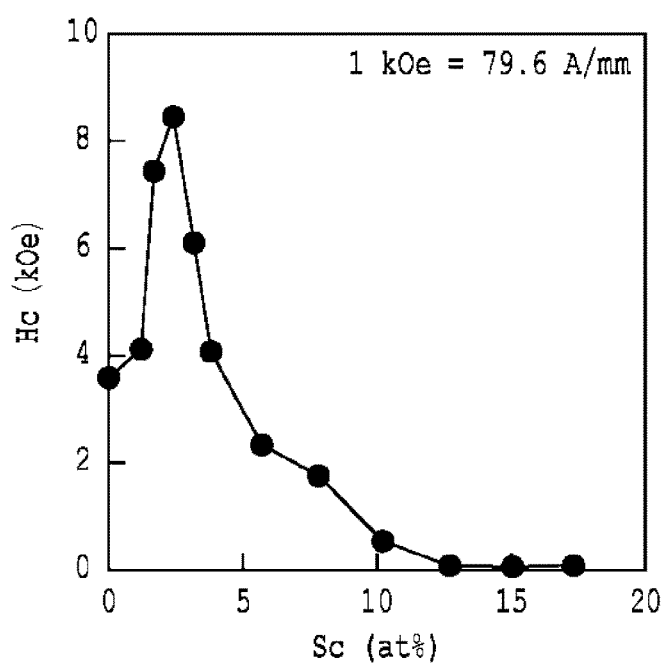
FIG. 5 is a graphical representation showing the relationship of the content of Sc and the coercive force Hc in the magnetic recording medium of Example 1.
Figure 6:
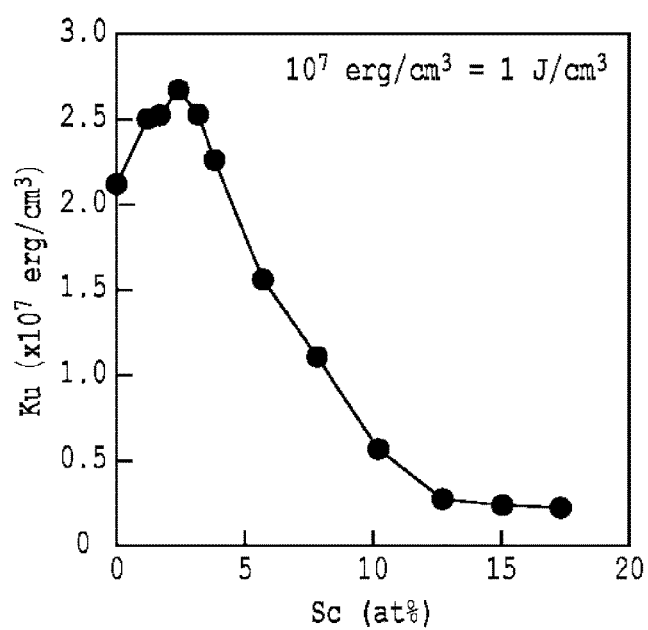
FIG. 6 is a graphical representation showing the relationship of the content of Sc and the magnetic anisotropy constant Ku in the magnetic recording medium of Example 1.

The relationship between the content of Sc in the magnetic recording layer 30 and the coercive force Hc is shown in FIG. 5. In addition, the relationship between the content of Sc in the magnetic recording layer 30 and the magnetic anisotropy constant Ku is shown in FIG. 6. As understood from FIGS. 5 and 6, the coercive force Hc and the magnetic anisotropy constant Ku increases when the magnetic recording layer contains Sc. Especially, in the case where the content of Sc was 2.4 at %, the coercive force Hc reached the maximum value of 8.5 kOe (680 A/mm), and the magnetic anisotropy constant Ku reached the maximum value of $26.7 \times 10^6$ erg/cm$^3$ ($2.67 \times 10^6$ J/m$^3$).

In view of the above, it is understood that addition of Sc into the $L1_0$ type ordered alloy is effective to development of excellent magnetic properties.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A magnetic thin film comprising an ordered alloy, wherein the ordered alloy comprises:
   at least one first element selected from the group consisting of Fe and Ni;
   at least one second element selected from the group consisting of Pt, Pd, Au and Ir; and
   a third element consisting of Sc, wherein the content of Sc is in a range from 1.2 at % to 3.8 at %".

2. The magnetic thin film according to claim 1, wherein the first element is Fe, and the second element is Pt.

3. The magnetic thin film according to claim 1, wherein the ordered alloy has an $L1_0$ type ordered structure.

4. The magnetic thin film according to claim 1 having a granular structure consisting of magnetic crystal grains comprising the ordered alloy, and a non-magnetic crystal grain boundary, wherein the non-magnetic crystal grain boundary comprises at least one material selected from the group consisting of carbon, boron, an oxide, and a nitride.

5. A magnetic recording medium comprising a non-magnetic substrate and a magnetic recording layer, wherein the magnetic recording layer comprises the magnetic thin film according to claim 1.

6. A magneto-resistive element comprising the magnetic thin film according to claim 1.

7. A magneto-resistive random access memory comprising the magneto-resistive element according to claim 6.

8. A tunnel magneto-resistive element comprising a fixed magnetic layer, a free magnetic layer, and a barrier layer, wherein the barrier layer is disposed between the fixed magnetic layer and the free magnetic layer, and least of the fixed magnetic layer and the free magnetic layer comprises the magnetic thin film according to claim 1.

9. A micro electro mechanical system comprising the magnetic thin film according to claim 1.

\* \* \* \* \*